United States Patent [19]

Raymond, Jr. et al.

[11] 4,139,786
[45] Feb. 13, 1979

[54] STATIC MOS MEMORY CELL USING INVERTED N-CHANNEL FIELD-EFFECT TRANSISTOR

[75] Inventors: Joseph H. Raymond, Jr.; Keith H. Gudger, both of Houston, Tex.

[73] Assignee: Texas Instruments Incorporated, Dallas, Tex.

[21] Appl. No.: 801,694

[22] Filed: May 31, 1977

[51] Int. Cl.$^2$ ............................................. G11C 11/40
[52] U.S. Cl. .................................... 307/238; 307/279; 357/23; 357/41; 357/59; 365/178; 365/182; 365/222
[58] Field of Search .................. 307/238, 304; 357/23, 357/41, 59, 91; 365/178, 182, 187, 188, 222

[56] References Cited

U.S. PATENT DOCUMENTS

| | | | |
|---|---|---|---|
| 3,576,571 | 4/1971 | Booher | 365/182 X |
| 3,618,053 | 11/1971 | Hudson et al. | 307/238 X |
| 3,699,544 | 10/1972 | Joynson et al. | 307/238 X |
| 3,876,993 | 4/1975 | Cavanaugh | 307/238 X |
| 3,922,650 | 11/1975 | Schaffer | 307/238 X |
| 3,955,181 | 5/1976 | Raymond, Jr. | 307/238 X |
| 4,031,608 | 6/1977 | Togei et al. | 357/41 X |
| 4,070,653 | 1/1978 | Rao et al. | 307/238 X |

OTHER PUBLICATIONS

Helwig, "Dynamic 4-FET Storage Cell"; IBM Tech. Discl. Bull.; vol. 15, No. 7, pp. 2205-2206; Dec. 1972.

Primary Examiner—Larry N. Anagnos
Attorney, Agent, or Firm—John G. Graham

[57] ABSTRACT

A storage cell employs two conventional N-channel MOS transistors and an inverted N-channel field-effect transistor along with an implanted polysilicon resistor and a resistor implanted under field oxide which functions as a junction field effect transistor. All of the transistors and a storage node as well as a voltage supply line are in one continuous moat region for a dense layout with a minimum of contacts. One MOS transistor is the access device connected between a bit line and the storage node with its gate connected to an address line. The other MOS transistor connects the storage node to the supply line and has its gate controlled by a second node which is connected to the supply line by a polycrystalline silicon strip which is the source-to-drain path of the inverted field-effect transistor; the gate of this device is a part of the moat which forms the storage node.

10 Claims, 7 Drawing Figures

STATIC MOS MEMORY CELL USING INVERTED N-CHANNEL FIELD-EFFECT TRANSISTOR

BACKGROUND OF THE INVENTION

This invention relates to semiconductor devices and more particularly to a static memory cell made of MOS transistors and an inverted field-effect transistor.

Static memory cells have the advantage of requiring no refresh overhead as needed in dynamic memories. Various static cell designs have been proposed such as that set forth in copending application Ser. No. 691,252, filed May 28, 1976, by G. R. Mohan Rao, assigned to Texas Instruments, which avoids refresh, but at the expense of larger cell size and increased power dissipation. Various "self-refreshing" cells have been used such as shown in U.S. Pat. No. 3,955,181, issued May 4, 1976 to Joseph H. Raymond, Jr., for Self-Refreshing Random Access Memory Cell, assigned to Texas Instruments. RAM cells of very simple construction are shown in pending U.S. patent applications Ser. No. 700,989, filed June 29, 1976, by G. R. Mohan Rao, David J. McElroy and Gerald D. Rogers, now U.S. Pat. No. 4,070,653; Ser. No. 754,208, filed Dec. 27, 1976 by David J. McElroy, now U.S. Pat. No. 4,092,735, and Ser. No. 762,916, filed Jan. 27, 1977 by David J. McElroy, all assigned to Texas Instruments. These prior cells provide either static operation, or apparently static operation in that refresh is accomplished without addressing the cells, and are of successively smaller cell size and had operating or process advantages. However, continuing improvement in cell size or power dissipation, as well as process compatibility, became necessary with higher density memories of the 16K and 64K variety.

It is a principal object of this invention to provide improved memory cells in semiconductor integrated circuits. Another object is to provide an improved static cell for MOS memory devices, particularly a static cell of small size and low power dissipation. An additional object is to provide small area memory elements in semiconductor integrated circuits, particularly made by processes compatible with MOS-LSI standard products.

SUMMARY OF THE INVENTION

A storage cell employs two conventional N-channel MOS transistors and an inverted N-channel field-effect transistor along with two implanted resistors. All of the transistors and a storage node as well as a voltage supply line are in one continuous moat region for a dense layout with a minimum of contacts. One MOS transistor is the access device connected between a bit line and the storage node with its gate connected to an address line. The other MOS transistor connects the storage node to the supply line and has its gate controlled by a second node which is connected to the supply line by a polycrystalline silicon strip which is the source-to-drain path of the inverted field-effect transistor; the gate of this device is a part of the moat which forms the storage node.

BRIEF DESCRIPTION OF THE DRAWINGS

The novel features believed characteristic of the invention are set forth in the appended claims. The invention itself, however, as well as other features and advantages thereof, will best be understood by reference to the following detailed description of illustrative embodiments, read in conjunction with the accompanying drawings, wherein:

FIG. 3a—3d are elevation views in section of the semiconductor device of FIG. 1, taken along the lines a—a, b—b, c—c, and d—d respectively.

DETAILED DESCRIPTION OF SPECIFIC EMBODIMENT

Figure 1:
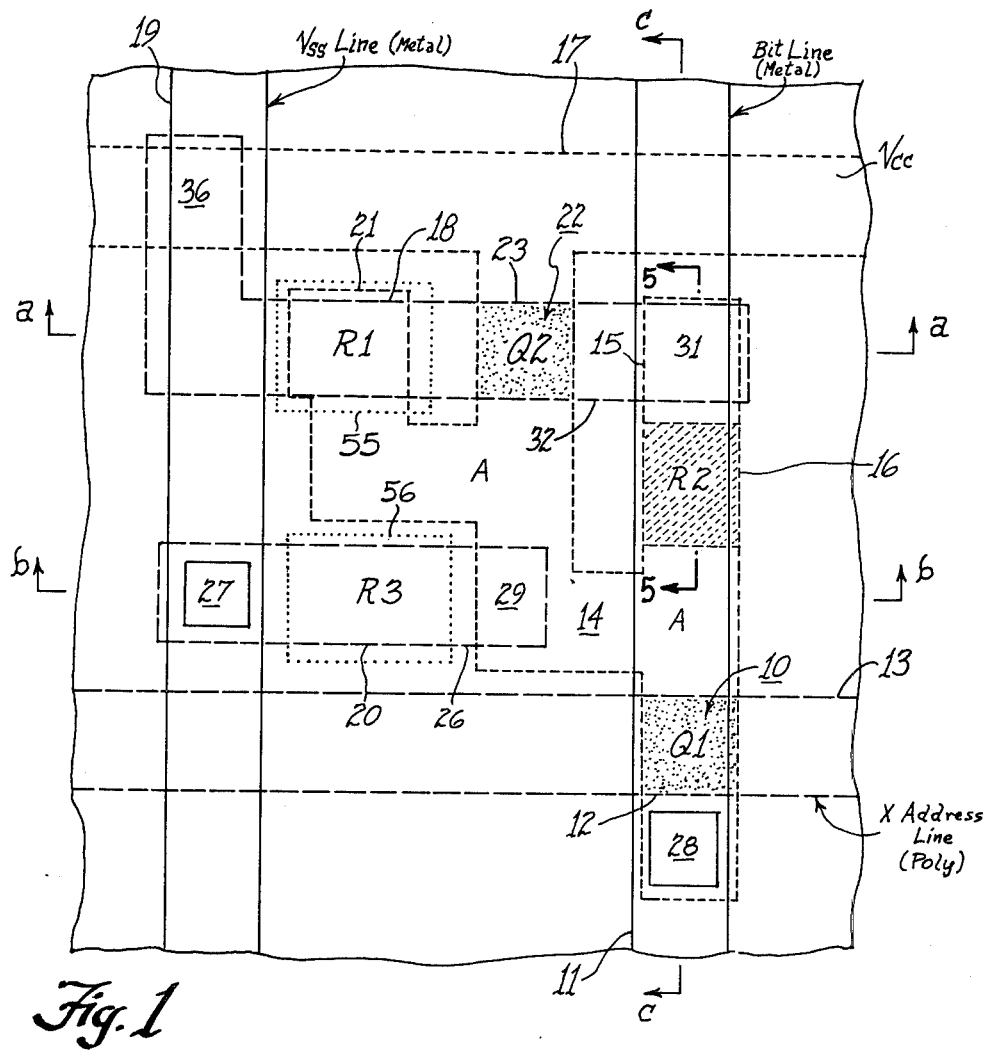
FIG. 1 is a greatly enlarged plan view of a small portion of a semiconductor chip showing the physical layout of a memory cell according to the invention.
Figure 2:
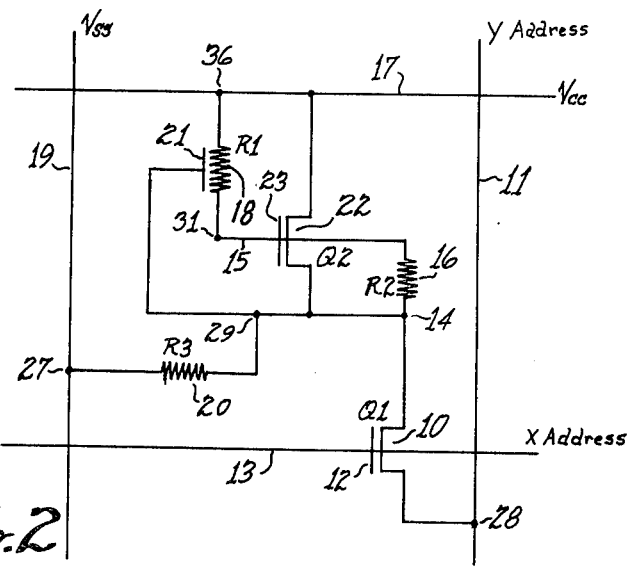
FIG. 2 is an electrical schematic diagram of the static memory cell of FIG. 1.

A memory cell according to the invention is illustrated in physical layout in FIG. 1 and in electrical schematic diagram in FIG. 2. The cell includes an N-channel MOS access transistor 10 which is connected to a Y-select line or bit line 11 in the form of an elongated metal strip. The gate 12 of the MOS transistor 10 is connected to an X-select or word line 13 which in this embodiment is a polycrystalline silicon metal strip. In a 16K array of these memory cells, there would be 128 Y lines and 128 X lines; only one cell is shown. The source-to-drain path of the transistor 10 is connected to a storage node 14, which is an N+ diffused moat region. The node 14 is connected to another storage node 15 by a resistor 16 which is an implanted resistor buried under field oxide as disclosed in pending applications Ser. No. 691,252, filed May 28, 1976 by G. R. Mohan Rao, or Ser. No. 700,989, filed Jan. 29, 1976 by Rao, McElroy and Rogers, now U.S. Pat. No. 4,070,653, both assigned to Texas Instruments. This resistor 16 will exhibit a magnitude of resistance determined by the voltage on the nodes 14 and 15. The node 15 is connected to a Vdd or Vcc supply line 17 by an inverted field-effect transistor 18 according to the invention. This transistor may include a lightly implanted area in a polycrystalline silicon strip as set forth in pending application Ser. No. 727,116, filed Sept. 27, 1976 by Rao, Stanczak, Lien and Bhatia, assigned to Texas Instruments, but is voltage-controlled by the node 14. The voltage supply line 17 is in this case part of the same N+ moat which forms the node 14. The node 14 is connected to a Vss or ground line 19, also a metal strip, by a resistor 20 which is an implanted polycrystalline silicon resistor device similar to the resistor 18, but not voltage-controlled, i.e., not overlying a moat region.

An important feature of the invention is the use of a "gate" region 21 for the resistor 18 to modulate the resistance magnitude exhibited between the node 14 and Vcc line 17. This gate region 21 is connected to the node 14 and indeed is part of the same moat region which forms the node 14. The impedance of the resistor 18 is low when the voltage on the node 14 is highly positive, or high when the node 14 is near ground.

Another conventional N-channel MOS transistor 22 connects the node 14 to the Vcc line 17, and the gate 23 of this transistor is part of or connected to the node 15. The source-to-drain path of the transistor 22 is part of the same continuous moat which forms the transistor 10, the node 14 and the Vcc line 17.

In operation, a logic "1" is written into the node 14 if the transistor 10 is turned on by a "1" on the address line 13 and a "1" on the bit line 11. Usually "1" is a positive voltage of about Vdd or Vcc, perhaps +5 v dc, and logic "0" is Vss. When the node 14 is high, the node 15 will tend to be high, holding the impedance of the resistor 18 very low by the large positive voltage on the gate 21 which attracts electrons in the polycrystalline silicon layer of the resistor 18, providing a channel. The transistor 22 is turned on by the high voltage on its gate 23 or the node 15. The impedance of the buried implanted resistor 16 is high when a "1" is stored because the reverse bias on the pn junction between the implanted N-region of the resistor and the P-substrate is high, depleting the resistor of carriers. Under these conditions, after the address on the line 13 goes to Vss and the transistor 10 cuts off, current flow through the series path of the resistors 18, and 16 will be relatively low because the resistor 16 is at a high value, yet the node 15 will be held at near the Vcc supply voltage on the line 17 because the impedance of the device 18 is low compared to that of the resistor 16, holding the transistor 22 on and reinforcing the high voltage or "1" logic level on the node 14 and the gate 21. It is important that when the node 14 charges to a positive "1" level, the resistor 18 becomes less resistive, which allows the gate 23 of the transistor 22 to charge up to "1" faster than would be possible if the resistor 18 did not change in value; this reduces the time period needed to write into the cell, thus reducing the specified "write time" for the memory device. When a "0" is written into the cell, the node 14 discharges into the line 11 which is at Vss. The impedance of the resistor 16 goes to a low value because the reverse bias of the pn junction between the resistor region and the substrate is reduced. the voltage on the node 15 and thus the gate 21 goes to near Vss, and the result is that the resistor or field-effect transistor 18 assumes a high resistance state. Current flow through the resistor 18 is low and the voltage drop across it is high; more of the drop between Vcc of line 17 and Vss of line 19 is across the resistor 18 rather than the resistor 16, compared to a stored "1". The transistor 22 is turned off as its gate 23 is at a low voltage. Thus, after the transistor 10 is cut off when the address goes back to zero, a stored "0" will be sustained on the storage node 14.

Figure 3A:
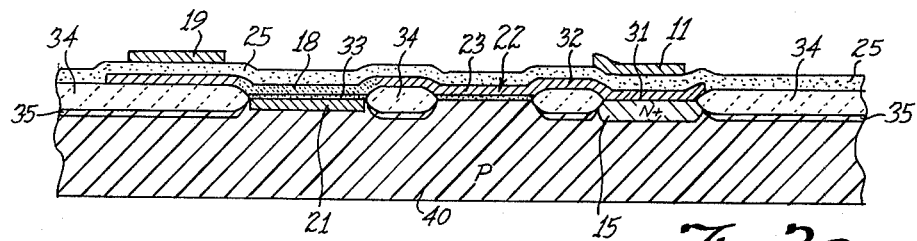
Figure 3B:
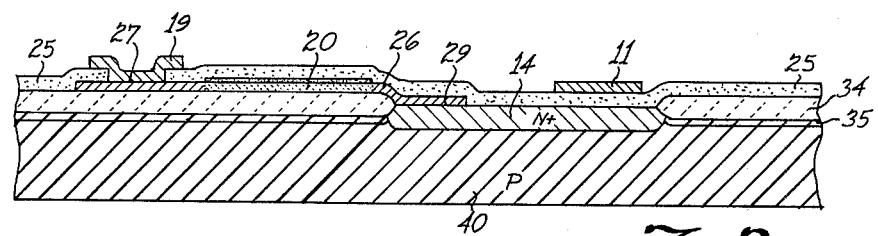
Figure 3C:
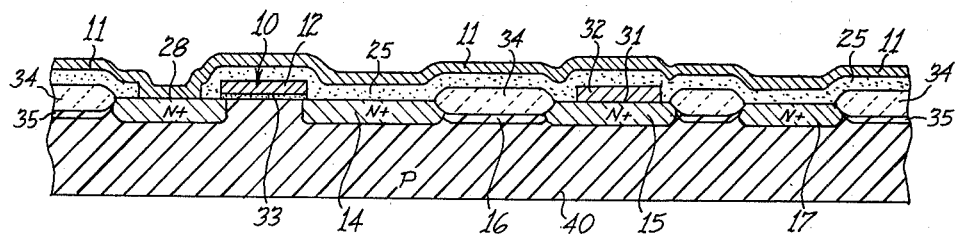

In FIGS. 3a, 3b and 3c sectional views of the cell of FIG. 1 show details of construction. A very small part of a semiconductor substrate is seen, perhaps one or two mils in width, it being understood that a memory device would contain perhaps 16384 cells in a silicon chip of less than one-twentieth square inch. The Vss and Y address lines 19 and 11 are metal strips, perhaps 0.2 mil wide and 1 micron thick, overlying a thick low temperature oxide layer 25. The metal lines contact the underlying moat or polycrystalline layer through holes in the oxide layer 25 at two points; the Vss line 19 contacts the end of a polycrystalline silicon strip 26 forming the resistor 20 at a contact area 27 and the Y or bit line 11 contacts one end of the moat at a contact area 28. The polysilicon strip 26 has the resistor 20 formed therein by a lightly implanted phosphorus doped region in the central part of the strip, while the ends of the strip are heavily doped with phosphorus to be highly conductive, "N+ type". A contact area 29 between the poly strip 26 and the N+ moat region of the node 14 makes the connection between the resistor and the node. A contact area 31 between the N+ moat of the node 15 and the poly strip 32 makes the connection at this point. A thin oxide coating 33 forms the gate insulators of the transistors 10 and 22 and the insulation between the underlying N+ gate 21 and "N-channel" inverted transistor or resistor 18. A thick field oxide coating 34 surrounded all of the most area, and P+ type channel stop regions 35 underly all of the field oxide areas except where the implanted resistor 16 is formed.

The polysilicon resistor 18 functions as an N-channel transistor with its gate formed by the moat beneath it, so it is inverted compared to the usual MOS transistors where the channel is in the moat and the gate in the polysilicon. The resistor 18 is lightly N-type or phosphorus-doped, and the ends of the poly strip 29 containing the resistor 18 are N+ to make ohmic connection to the Vcc line at a poly-to-moat contact area 36 as well as area 31.

Referring now to FIGS. 4a–4f and 5a–5f, a process for making the MOS integrated circuit device of FIGS. 1 and 3a–3c will be described. FIGS. 4a–4f and 5a–5f represent sectional views along the lines a—a and 5—5 of FIG. 1, chosen to illustrate formation of the transistor 10, the field-implanted resistor 16, and the N-channel implanted polycrystalline silicon resistors 18 and 20. The starting material is a slice of P-type monocrystalline silicon, perhaps 3 inches in diameter and 20 to 40 mils thick, cut on the <100> plane, of a resistivity of about 6 to 8 ohm-cm. In the FIGS, the part shown of a chip or bar 40 represents only a very small part of the slice, perhaps one or two mils wide or one ten-millionth of the slice. After appropriate cleaning, the slice is oxidized by exposing to oxygen in a furnace at an elevated temperature of perhaps 1000° C to produce an oxide layer 41 of a thickness of about 1000Å. Next, a layer 42 of silicon nitride of about 1000Å thickness is formed by exposing to an atmosphere of silane and ammonia in an rf plasma reactor. A coating 43 of photoresist is applied to the entire top surface of the slice, then exposed to ultraviolet light through a mask which defines the desired pattern of moats, and developed providing an inverse moat pattern. In place of uV light and glass masks as used at present, resist may be exposed by an electron beam to produce smaller geometries, as set forth at Bell Laboratories Record, March 1976, p. 69–73 or Electronic Products, February 1977, p. 17. The photoresist operation leaves areas 44 where nitride is to be etched away by an etchant which removes the exposed part of the nitride layer 42 but does not remove the oxide layer 41 and does not react with the photoresist 43. In these areas 44 the P+ channel stop regions are to be formed.

The slice is now subjected to an ion implant step, whereby boron atoms are implanted into areas 45 of silicon not covered by photoresist 43 and nitride 42 to create what will later be the channel stops. The photoresist is preferably left in place to mask the implant. The oxide layer 41 during the implant prevents implanted phosphorus from out-diffusing and minimizes surface damage. This implant is at a dosage of about $4 \times 10^{12}/cm^2$ at 100KeV. As will be seen, the region 45 does not exist in the same form in the finished device, because some of this part of the slice will have been consumed in the field oxidation procedure.

Next, the photoresist coating 43 is removed and another photoresist coating 46 is applied over the entire slice, then exposed to uV light through a mask which exposes everything except what is to become the resistor 16. Upon developing, unexposed photoresist is removed in an area 47 in FIGS. 4b and 5b. The regions 45 of the channel stop are covered. The nitride layer 42 is etched away in the area 47, the oxide 41 is left in place as before, and then the slice is subjected to a phosphorus implant at 100KeV at a dosage of about 3 to 5 × $10^{11}/cm^2$, producing an implanted region 48. The selection of energy level used will provide a control over the cut-off voltage, with higher every level providing a higher cut-off. The remaining photoresist 46 then would be removed.

As set forth in copending patent application Ser. No. 648,593, filed Jan. 12, 1975 by G. R. Mohan Rao, now U.S. Pat. No. 4,055,444, assigned to Texas Instruments, the next step in the process is to subject the slice to a heat treatment or annealling step, during which the slice is maintained at a temperature of about 1000° C for perhaps approximately 2 hours in an inert atmosphere, preferably nitrogen. This step causes the implanted boron and phosphorus concentrations to exhibit a redistribution which has desirable effects, and also causes a reduction in bulk damage in the crystal structure. The P+ and N impurities will have penetrated deeper into the silicon surface after anneal.

Figures 4, 5:
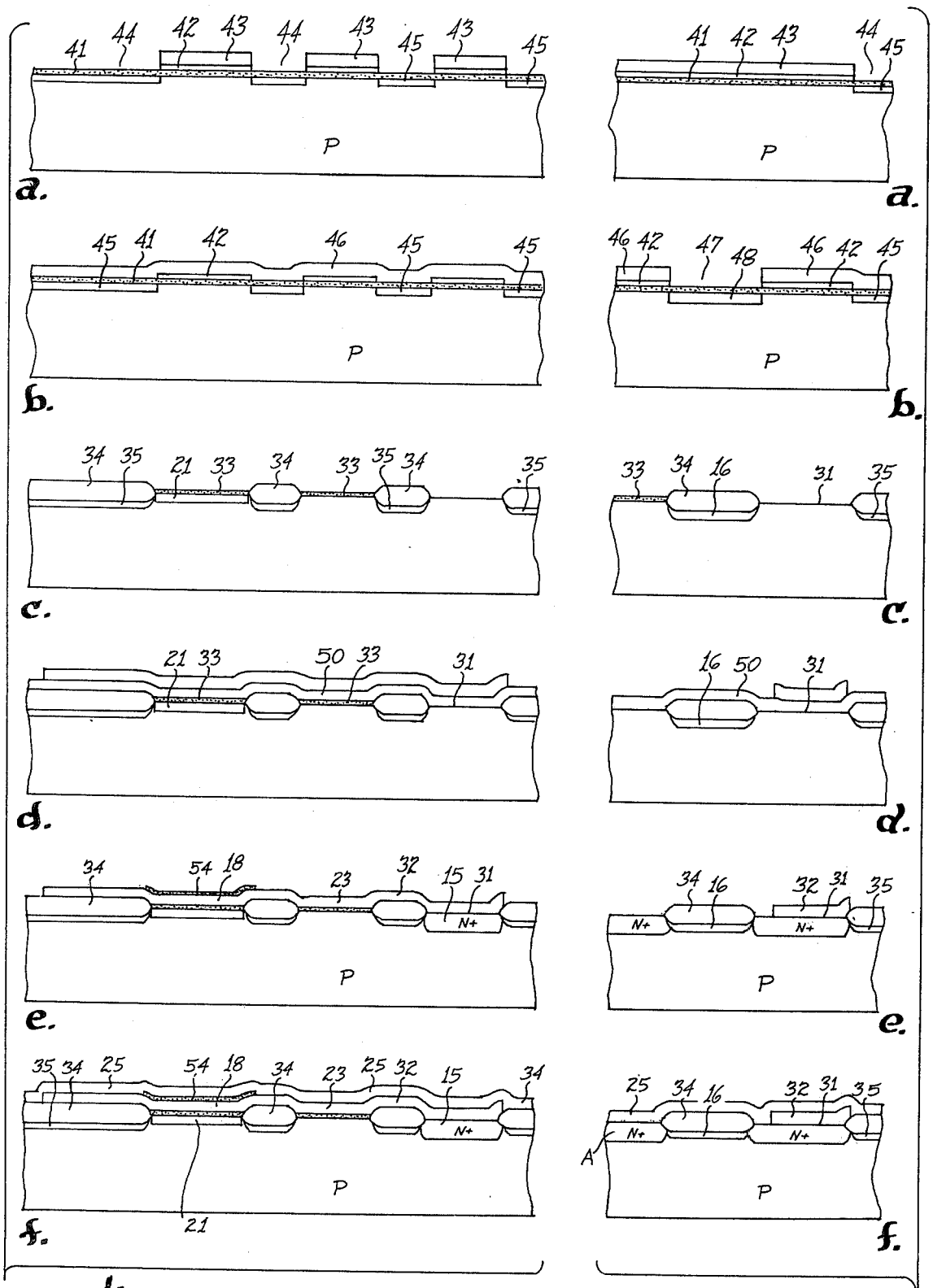
FIGS. 4a-4f are elevation views in section of the semiconductor devices of FIGS. 1 and 3a—3d, at successive states in the manufacturing process, taken along the lines a—a or 5—5 in FIG. 1.

The following step in the process is formation of field oxide 34, which is done by subjecting the slices to steam or an oxidizing atmosphere at about 900° C for perhaps 10 hours. This causes a thick field oxide region or layer 34 to be grown as seen in FIGS. 4c and 5c, and this region extends into the silicon surface because silicon is consumed as it oxidizes. The nitride layer 42 masks oxidation beneath it. The thickness of this layer 34 is about 8000 to 10,000Å, about half of which is above the original surface and half below. The boron doped P+ regions 49 and the phosphorus doped N region 48 formed by implant and modified by the anneal step will be partly consumed, but will also diffuse further into the silicon ahead of the oxidation front. Thus, P+ "channel-stop" regions 35 and the N resistor region 16 will result which will be of proper concentration near the surface and will not have the extent of crystalline structure damage characteristic of some implanted devices.

The nitride layer 42 and its underlying oxide layer 41 are removed by etching, as the next step, and another thin oxide layer 33 of about 800Å is grown over the exposed areas of silicon. This layer 33 later becomes the gate insulators of the transistors as well as the dielectric between the gate 21 and the poly resistor 20. The gate region 21 is now phosphorus implanted, employing a photoresist mask step which exposes only the part of the moat which will be the gate 21; this region cannot be N+ diffused later because it is covered by poly and gate oxide. The implant dosage is about $10^{16}$. Windows for polycrystalline silicon-to-silicon or poly-to-moat contacts are next patterned and etched in the oxide layer 33 using photoresist. Then, a layer 50 of polycrystalline silicon is deposited over the entire slice in a reactor using standard techniques as by decomposition of silane in hydrogen at about 950° C to a thickness of about 0.5 micron, producing polysilicon which will become the gate 12 of the transistor 10 and the strips 26 and 29. The polycrystalline silicon should be highly resistive or low concentration so that the resistors 18 and 20 can be formed with control over resistivity.

The polysilicon layer and underlying gate oxide or thin oxide layer 33 are next patterned by applying photoresist, exposing to ultraviolet light through a mask prepared for this purpose, developing, then etching with the remaining photoresist covering certain areas of the polysilicon. The resulting structure is seen in FIGS. 4e and 5e, where a part of the remaining polysilicon layer provides what will be the gate of MOS transistor 10, the gate 23 of the transistor 22 and the strips 26 and 32; the thin oxide 33 underneath the poly is the gate oxide of the transistors and the field-effect device 18. The same layers also provide gate and gate oxide for all the other transistors on the slice, as well as capacitors if any are needed in peripheral circuits. After patterning the poly, a protective cap of silicon dioxide is grown over the polysilicon, producing a coating 54 on all exposed surfaces of the poly, including tops and sides. The coating 54 is grown at about 900° C in steam for perhaps two hours, producing approximately 2000 to 3000Å thickness and consuming part of the polysilicon. The cap is to prevent subsequent deposition of impurity on the resistors 18 and 20 or diffusion into these resistors.

The remaining polysilicon coating is now subjected to a phosphorus implant which creates the characteristics of the resistors 18 and 20. Areas of poly which are to be highly conductive will be later subjected to a phosphorus diffusion which will leave them highly doped. To define the resistors 18 and 20 this phosphorus implant is at 100 to 150 KeV to a dosage of from 5 × $10^{13}$ to 1 × $10^{14}$ atoms per $cm^2$, depending upon the desired sheet resistivity. Following the implant, the slice is annealled in $N_2$ for 30 minutes at 1000° C to distribute the phosphorus or boron properly in the polysilicon.

A photoresist mask and etch operation is next used to remove the coating 54 on all areas of the polysilicon except the resistors 18 and 20. The mask used to protect the resistors leaves oxide over areas defined by dotted lines 55 and 56 in FIG. 1; these are much wider than the resistors, allowing a rather wide margin for error in mask alignment. The resulting structure is seen in FIGS. 4e and 5e.

Using the thin oxide 33, protective cap 54, and field oxide 34 as a diffusion mask, the slice is now subjected to an N+ diffusion, whereby phosphorus is diffused into the silicon slice 40 as seen in FIG. 4e and 5e to produce regions 11, 14, 15 and 21. Phosphorus diffuses into the exposed polysilicon, so it becomes heavily doped N+ and very conductive. The poly does not mask the diffusion, so N+ regions are created beneath the poly where there is no thin oxide 33. The depth of diffusion is about 8000 to 10,000Å. The N+ diffused regions function as conductors which connect the various regions together, and also function as the source or drain regions of all the MOS transistors and the gate 21.

As seen in FIGS. 4f or 5f, fabrication of the device is continued by depositing the layer 25 of phosphorus-doped oxide. Rather than by oxidizing, this is done by a low temperature reaction process using conventional chemical vapor deposition techniques. The layer 25 is about 6000 to 10,000Å, covering the entire slice. Subsequently, windows are opened in the oxide layer 25 in areas 27 and 28 where contact is to be made to the polysilicon layer. Thus, a layer of aluminum is deposited on the entire slice, and etched away using photoresist masking to provide the desired pattern of metal interconnections 11 and 19.

Subsequently, the slice would be covered with protective oxide and this oxide would be patterned to expose bonding pads. Then the slice is scribed and broken into separate chips, each containing a 16K array of cells along with peripheral decoder and I/O circuitry, and the chips are mounted in sealed packages.

The cell of FIG. 1 is duplication in an array by rotating about the Vcc line 17 and the Vss line 19 so that these lines as well as contacts 36 and 27 are shared with mirror-image cells above and to the left. In like manner, the contact 28 is shared with a mirror-image cell below the cell shown in FIG. 1.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore, contemplated that the appended claims will cover any such modifications or embodiments as fall within the true scope of the invention.

What is claimed is:

1. A semiconductor integrated circuit comprising first and second MOS transistors each having a source-drain path and a gate, the source-drain path of the first transistor being connected between a first node and a source of logic levels, the gate of the first transistor being connected to a different source of logic levels, the source-drain path of the second transistor being connected between the first node and a voltage supply, the gate of the second transistor being connected to a second node, means exhibiting substantial impedance connecting the first node to the second node, an impedance element connecting the second node to the voltage supply, the impedance element exhibiting a low impedance state when the voltage on the first node is of a first level and exhibiting a high impedance state when the voltage on the first node is of a second level, the first level being substantially different in voltage from the second level, and impedance means connecting the first node to reference potential.

2. A circuit according to claim 1 wherein the impedance element is a polycrystalline silicon layer overlying a face of a body of material and has a low impurity concentration.

3. A circuit according to claim 2 wherein the layer overlies a moat region providing the first node separated therefrom by thin silicon oxide.

4. A circuit according to claim 2 wherein the source of logic levels is a bit line in a memory array, the different source of logic levels in an address line in the memory array, and the first node is a storage node capable of sustaining a logic "1" or logic "0".

5. A storage cell comprising an address line, a data line, a storage node, a first controlled switching device having a current path connecting the data line to the storage node and being controlled by the address line, a voltage supply, a second controlled switching device having a control element and having a current path connecting the storage node to the voltage supply, means exhibiting significant impedance connecting the storage node to a second node, the second node being connected to the control element of the second switching device, voltage-controlled impedance means connecting the voltage supply to the second node and controlled by the voltage on the storage node, and second impedance means connecting the storage node to reference potential.

6. A storage cell according to claim 5 wherein the controlled switching devices are MOS transistors and the voltage-controlled impedance means is an inverted field effect transistor having its source-to-drain path overlying its gate.

7. A storage cell according to claim 6 wherein the inverted field effect transistor is of the N-channel type.

8. A storage cell according to claim 6 wherein the gate is a moat region in a face of a semiconductor body.

9. A storage cell according to claim 8 wherein one continuous moat region provides the voltage supply line, the storage node, the source-to-drain paths of the first and second switching devices, and said gate.

10. A storage cell according to claim 5 wherein the cell is within a semiconductor integrated circuit and the voltage-controlled impedance means is formed by an elongated polycrystalline silicon region overlying the face of a body of semiconductor material but has low net impurity concentration.

* * * * *